United States Patent
Telford et al.

(10) Patent No.: US 6,242,111 B1
(45) Date of Patent: Jun. 5, 2001

(54) ANODIZED ALUMINUM SUSCEPTOR FOR FORMING INTEGRATED CIRCUIT STRUCTURES AND METHOD OF MAKING ANODIZED ALUMINUM SUSCEPTOR

(75) Inventors: Susan G. Telford; Craig Bercaw, both of Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/119,444

(22) Filed: Sep. 8, 1993

Related U.S. Application Data

(63) Continuation of application No. 07/946,505, filed on Sep. 17, 1992, now abandoned.

(51) Int. Cl.$^7$ ................................................... C25D 11/02
(52) U.S. Cl. ......................... 428/629; 428/654; 205/206; 205/208; 205/317; 205/324; 205/325; 205/332
(58) Field of Search .............................. 205/50, 206, 205, 205/317, 324, 325, 332; 428/629, 654; 118/715, 728

(56) References Cited

U.S. PATENT DOCUMENTS

| | | | |
|---|---|---|---|
| 4,481,084 | * 11/1984 | Chen et al. | 205/224 |
| 5,039,388 | 8/1991 | Miyashita et al. | 204/192.32 |
| 5,104,514 | * 4/1992 | Quartarone | 205/206 |
| 5,203,958 | * 4/1993 | Arai et al. | 156/643 |
| 5,220,140 | * 6/1993 | Ball et al. | 219/10.55 F |

OTHER PUBLICATIONS

Lichtenberger–Bajza et al., "Rapid Arodizing of Aluminum in Mixed Osalic–Formic Acid Baths", Electroplating and Metal Finishing; 10–1962; pp. 342–348.*

* cited by examiner

Primary Examiner—Kathryn Gorgos
(74) Attorney, Agent, or Firm—John P. Taylor

(57) ABSTRACT

Disclosed is a method of making an anodized aluminum susceptor capable of withstanding an elevated temperature of 590° C., or a temperature as high as 475° C. in the presence of an NF$_3$ plasma, without peeling or cracking, which preferably comprises selecting a high purity or low magnesium aluminum alloy, roughening the surface of the alloy, and then anodizing the surface roughened alloy in an electrolyte comprising an organic acid to form the desired anodized aluminum oxide coating thereon. Further, the invention comprises a high purity or low magnesium aluminum alloy susceptor and an organic acid anodic coating thereon highly resistant to spalling or cracking at elevated temperatures.

48 Claims, 1 Drawing Sheet

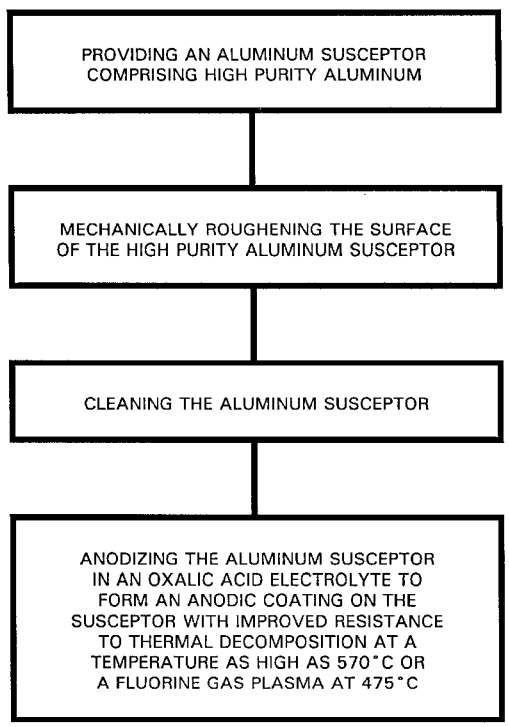

```
┌─────────────────────────────────────────────┐
│  PROVIDING AN ALUMINUM SUSCEPTOR            │
│  COMPRISING HIGH PURITY ALUMINUM            │
└─────────────────────────────────────────────┘
                      │
                      ▼
┌─────────────────────────────────────────────┐
│  MECHANICALLY ROUGHENING THE SURFACE        │
│  OF THE HIGH PURITY ALUMINUM SUSCEPTOR      │
└─────────────────────────────────────────────┘
                      │
                      ▼
┌─────────────────────────────────────────────┐
│  CLEANING THE ALUMINUM SUSCEPTOR            │
└─────────────────────────────────────────────┘
                      │
                      ▼
┌─────────────────────────────────────────────┐
│  ANODIZING THE ALUMINUM SUSCEPTOR           │
│  IN AN OXALIC ACID ELECTROLYTE TO           │
│  FORM AN ANODIC COATING ON THE              │
│  SUSCEPTOR WITH IMPROVED RESISTANCE         │
│  TO THERMAL DECOMPOSITION AT A              │
│  TEMPERATURE AS HIGH AS 570°C OR            │
│  A FLUORINE GAS PLASMA AT 475°C             │
└─────────────────────────────────────────────┘
```

ANODIZED ALUMINUM SUSCEPTOR FOR FORMING INTEGRATED CIRCUIT STRUCTURES AND METHOD OF MAKING ANODIZED ALUMINUM SUSCEPTOR

This is a continuation of copending application(s) Ser. No. 0 7/946,505 filed on Sep. 17, 1992, now abandoned.

BACKGROUND OF THE INVENTION

1. Field of the Invention

This invention relates to an improved anodized aluminum susceptor for use in apparatus for forming integrated circuit structures, and a method of making such a susceptor. More particularly, this invention relates to an anodized susceptor, and method of making the same, wherein the anodized coating on the susceptor is capable of withstanding high temperatures and $NF_3$ plasma without peeling and without contaminating a wafer processed thereon with impurities contained in the aluminum susceptor.

2. Description of the Related Art

In the formation of integrated circuit structures, certain processes such as plasma-assisted chemical vapor deposition processes are carried out in a vacuum chamber of a reactor wherein the wafer is mounted on a platform referred to as a susceptor which usually serves not only as a support for the wafer, but also as one of the electrodes for generation of the plasma. The susceptor is usually formed of aluminum, due to the availability and cost of the metal, as well as its machinability.

It is customary to anodize the aluminum susceptor, to protect the susceptor surface, and to provide an aluminum oxide surface which is relatively inactive to the processing being carried out in the reactor during deposition on the wafer. For example, the anodized surface prevents or inhibits reaction of the aluminum surface with fluorine-containing processing gases such as $NF_3$, $SF_6$, or fluorocarbons, which may form aluminum fluoride on the susceptor surface.

Conventionally, such aluminum susceptors have been formed from AA6061 aluminum alloy because of this alloy's additional mechanical strength at room temperature, even though it is known that the mechanical strength of this alloy at the operating temperatures used in processing semiconductor wafers is not necessarily higher than other aluminum alloys.

Formation of an anodized coating on such aluminum susceptors made from AA6061 aluminum alloy, using conventional sulfuric acid anodizing, provides an anodized layer of aluminum oxide capable of withstanding the corrosive reaction of fluorine-based chemistry up to temperatures high as 475° C. in the presence of a plasma. However, this conventional aluminum susceptor does experience cracking of the anodized film.

Also, the AA aluminum alloy 6061 contains a number of alloying elements, added thereto to achieve certain properties, including from 0.8 to 1.2 wt. % magnesium. It has been found that under certain conditions encountered when processing a wafer mounted on such an anodized susceptor, magnesium atoms in the AA 6061 alloy migrate through an anodized aluminum oxide coating and detrimentally interfere with the deposition being carried out in the chamber.

When aluminum alloys having a lower magnesium content were substituted for the AA6061 alloy, e.g., AA1100 alloy, in an attempt to solve the magnesium contamination problem, it was discovered that such higher purity alloys did not form an anodic coating in sulfuric acid which would withstand cracking as well as peeling when exposed to temperatures as high as 590° C., or a combination of an $NF_3$ plasma and an elevated temperature of 475° C.

While surface roughening of the surface of an aluminum alloy, prior to anodization, has been previously practiced for other purposes and such surface roughening does overcome the cracking and peeling problem, it has also been found the use of sulfuric acid itself as the anodization electrolyte can be a source of contamination. Anodization of aluminum alloys in a sulfuric acid electrolyte have been found to result in the formation of particles having an undesirably high sulfur content.

U.S. Pat. No. 5,039,388 discloses forming an anodic coating on a high purity aluminum electrode using a chromic acid electrolyte instead of sulfuric acid, as noted. However, such coating can still suffer from high decomposition and resultant coating loss, particularly at higher temperature applications, e.g., 590° C., and the resultant contamination problems attendant therewith. Furthermore, the use of anodizing electrolytes containing chromium ions can result in the formation of an anodized layer containing chromium, a substance known to reduce device reliability and stability, particularly in CVD-formed dielectric coatings, apparently because of the mobility of the chromium.

Thus, there is a great need for forming an anodized coating on an electrode formed from an aluminum alloy, such as a high purity aluminum alloy, which will withstand these conditions and prevent contamination of the wafer. The present invention provides such a anodized coating on an electrode formed from an aluminum alloy, particularly a high purity aluminum alloy electrode.

SUMMARY OF THE INVENTION

The invention comprises a method of making an anodized aluminum susceptor capable of withstanding an elevated temperature of 590° C., or a combination of an $NF_3$ plasma and a temperature as high as 475° C., without peeling or cracking and wherein wafer contamination by sulfur, magnesium, or chromium contaminants does not occur. The method comprises selecting an aluminum alloy having a low magnesium content for forming the aluminum susceptor, preferably a high purity aluminum alloy; mechanically roughening the surface of the aluminum susceptor; and then anodizing the surface roughened aluminum susceptor in an organic acid such as oxalic acid to form the desired anodized aluminum oxide coating thereon. Further the invention comprises an aluminum susceptor having an organic acid-anodized anodic coating formed thereon which is highly resistant to spalling or cracking at elevated temperatures. Preferably, the aluminum susceptor is formed with an anodic coating thereon formed in oxalic acid.

BRIEF DESCRIPTION OF THE DRAWING

The sole FIGURE is a flowsheet illustrating the process of the invention.

DETAILED DESCRIPTION OF THE INVENTION

The susceptor or electrode of the invention, used for high frequency plasma treatments, e.g., chemical vapor deposition (CVD) of materials used in semiconductor devices, is formed from a low magnesium content aluminum, and preferably a high purity aluminum. By aluminum as used herein, it is meant aluminum or its alloys, wherein at least 50 wt. % and preferably at least about 90 wt. % of the aluminum alloy constitutes aluminum. By low magnesium content aluminum, it is meant aluminum containing 0.05 wt. % or less magnesium. By high purity aluminum, it is meant aluminum containing at least 98.7 wt. % aluminum, preferably at least 99 wt. % aluminum, and typically at least 99.3 wt. % aluminum and containing not more than 0.05 wt. % magnesium, and typically less than 0.03 wt. % magnesium. Such high purity aluminum alloys can include Aluminum Association (AA) alloys: 1030, 1035, 1040, 1045, 1050, 1055, 1060, 1065, 1070, 1075, 1080, 1085, 1090, 1095, 1100, 1200, 1230, 1135, 1235, 1435, 1145, 1345, 1250, 1350, 1170, 1175, 1180, 1185, 1285, 1188 and 1199; the compositions of which are incorporated herein by reference. These high purity alloys are referred to herein as AA1000 series aluminum alloys.

Further, the susceptor, in accordance with one embodiment of the invention, can be comprised of a base material having a cladding of such high purity aluminum alloy thereon. The base material can be any base material useful as an electrode. Preferably, the base material is an aluminum base material. Typically, such a base material can be an aluminum base material, such as AA6061, with high strength and machinability as required in forming a susceptor such as AA6061, and the cladding can be selected from the AA1000 series aluminum alloys, e.g., AA1100. For purposes of forming said clad susceptor, instead of machining, the susceptor may be formed by coining operations.

The anodized aluminum susceptor, which is normally disc shaped, is formed in a number of steps which may include machining or forming type steps. In accordance with one aspect of the invention, such steps further include a controlled surface roughening step. Preferably, the surface-roughening step comprises a mechanical roughening step which is accomplished by blasting the surface of the susceptor with fine beads or grit of aluminum oxide. The provision of such mechanical roughening using a grit such as aluminum oxide grit is required to provide a better mechanical interlock or bonding between the surface and the subsequently formed oxide thereon and to reduce the degree of compressive stress of the oxide on the surface.

Typically, the aluminum oxide grit has a size of about 320 grit ANSI (American National Standard Institute). However, grit size can range from 80 to 400 grit ANSI. For purposes of the present invention, the roughness average (Ra) obtained should be in the range of 30 to 70 micro inches ($\mu$"). The term Ra may be defined as the average distance of the peaks and valleys from the mean on the roughened surface. Preferably, the Ra is in the range of 40 to 60 $\mu$", with a typical Ra being about 50 $\mu$".

The bead blasting is accomplished at a pressure of about 20 PSI; however, such pressure may be varied ±10 PSI to obtain the desired effects. Further, the surface of the susceptor is preferably held vertically and bead blasted by making a number of passes in the vertical direction and a number of passes in the horizontal direction. Also, all surfaces of the susceptor are roughened.

After the mechanical roughening step, the roughened surface is subject to cleaning which may include a chemical etch to remove entrained blast media, as well as to remove the compressively stressed skin from the bead blasting step. Such chemical etching may comprise etching in an acid or caustic solution or even an electrochemical etching. For example, the chemical etch may be carried out in an acid bath of 6% sulfuric acid and 4% phosphoric acid at a temperature of about 71° C. (160° F.) for about 30 second, followed by rinsing in water. The susceptor preferably is also conventionally degreased and deoxidized prior to anodizing.

It should be noted that in some instances, the above described chemical etching may itself serve to provide sufficient roughening of the aluminum surface without the need for the preceding mechanical roughening step.

The anodizing electrolyte may comprise any organic acid electrolyte or organic acid compound, or combination of organic acid electrolyte and inorganic acid electrolyte, which will provide an anodic coating, on the aluminum susceptor, which has high resistance to decomposition at elevated temperatures, e.g., up to about 590° C., and which has high resistance to plasmas containing fluorine-containing gases at elevated temperatures as high as about 475°.

Such decomposition and corrosion may result in a decrease in thickness of the protective anodized coating during plasma processing of a wafer positioned on the electrode or susceptor and the resultant contamination therefrom. Thus, a coating which is highly resistant to decomposition and corrosion has the highly desirable effect that it does not contaminate the wafer, for example, during deposition or etching steps performed thereof.

Anodic coatings formed in inorganic acids under conventional anodizing conditions have the problem that they are subject to decomposition during plasma processing of the wafer. For example, sulfuric acid-anodized coatings may contain a sulfur content greater than 2%. Such sulfuric acid coatings may begin to decompose when exposed to temperatures in the range of about 300 to 400° C., releasing sulfur contaminants and other aluminum alloying elements occluded in the film. For example, the use of sulfuric acid-anodized coatings can result in the formation of particles containing a detrimental amount of sulfur. What other elements may be so released will depend on the alloy selected for the susceptor surface. For example, aluminum alloy AA6061 may release high levels of magnesium. The use of other inorganic electrolytes may result in similar problems because the use of such inorganic electrolytes in the anodization of aluminum often results in the formation of a porous anodic coating which has lower stability at elevated temperatures. For example, the use of an electrolyte which contains $CrO_3$ can produce an anodized layer with chromium incorporated therein, a substance known to reduce device reliability and stability, particularly in CVD-applied dielectrics, because of the mobility of the chromium ion.

Thus, the preferred electrolyte used to anodize the aluminum susceptor in accordance with the present invention comprises an organic acid electrolyte, and more preferably, a dicarboxylic acid such as oxalic acid. An organic acid electrolyte such as an oxalic acid type electrolyte has the advantage that the film formed contains low levels of carbon compounds, e.g., about 5 to 10%. Decomposition of the anodized film by carbon migration occurs at a temperature much higher, i.e., in the range of 500 to 590° C., thereby resulting in a more stable film.

Further, a dicarboxylic acid type electrolyte such as oxalic acid has the advantage that a purer, thicker, denser and harder anodic film can be formed having higher oxide content, thereby providing greater resistance to eradication during plasma processing of the wafer thereon.

While reference is made to oxalic acid, any dicarboxylic acid having 2 to 8 carbon atoms may be used to form a film having the desired properties, as noted. Such acids include, for example, malonic acid, succinic acid, glutaric acid, adipic acid, pimelic acid, suberic acid, maleic acid, malic acid, and tartaric acid. However, for purposes of illustration, and not of limitation, the organic acid will hereinafter be referred to as oxalic acid.

It should also be noted that other organic acids, such as, for example, glycolic acid, citric acid, mellitic acid, phosphonic acid, or phosphinic acid, may be employed individually or in combination with the dicarboxylic acid electrolyte. For example, such organic acids may be employed in combination with oxalic acid. Further, oxalic acid or other dicarboxylic acids, may be used in combination with inorganic acids, such as sulfuric acid or phosphoric acid, for example. Thus, such combinations are contemplated and deemed to be within the purview of the invention.

However, for purposes of illustration, and not of limitation, the organic acid used in the anodization will hereinafter be referred to as oxalic acid.

For purposes of anodization, the aqueous based electrolyte comprising oxalic acid may contain from about 1 to about 10 wt. % oxalic acid, preferably from about 2 to about 7 wt. % and typically about 5 wt. % oxalic acid, with the balance comprising water, and/or other anodizing electrolyte additives.

The temperature of the electrolyte during the anodizing process step is normally maintained at about room temperature, but may range from about 20° C. to about 30° C.

The current density employed during the anodizing step may range from about 5 to 25 amps/ft$^2$ and voltage may be from about 10 to about 400 volts. Direct current (DC), alternating current, or a pulsed square wave may be used, although DC is preferred. Variations within these current density and voltage parameters can be employed. For example, a constant voltage, e.g., 20 volts, may be employed until the amperage drops, and then the voltage may be increased until the current density reaches a predetermined level, e.g., 15 amps/ft$^2$. Further, the current density may be maintained at the desired level until the desired film thickness is obtained. The anodic film thickness preferably ranges from 0.2 to 0.8 mils and typically 0.3 to 0.7 mils.

After anodizing, the susceptor is rinsed thoroughly in deionized water and dried.

While the invention has been described with respect to the use of high purity aluminum for the susceptor, its use is not necessarily limited thereto. That is, aluminum alloys such as AA6061 may be used as susceptors with the organic acid electrolyte, as described. However, even though the higher density and purer oxide can be obtained utilizing electrolysis comprising oxalic acid type electrolyte, it is believed that best results are obtained with the use of purer alloys of aluminum, and in particular with the use of AA Series 1000 type aluminum alloys.

To further illustrate the invention, a number of susceptors, each having a diameter of 6" and thickness of 6 millimeters (mm), were prepared respectively from either AA1100 or AA6061 aluminum alloys, representing respectively low and high magnesium content aluminum alloys. Samples 1–2 and 7–8 were formed from AA1100 aluminum alloy and samples 3–6 were formed from AA6061 aluminum alloy.

Sample 1–3 and 6 of the susceptors were bead blasted with Al$_2$O$_3$ beads having a size of 320 grit. The blasting was carried out at a pressure of about 20 PSI and by making bead blasting passes in the horizontal and vertical direction on the susceptor which was held in the vertical position. After bead blasting, the susceptors so treated had a roughness average (Ra) of about 50 ∥".

All the susceptors were then cleaned, degreased, and deoxidized, after which they were anodized in an aqueous base electrolyte. Susceptors samples 2–4 and 8 were then anodized in an electrolyte containing 5 wt. % oxalic acid (indicated as OA in the table) in which case the electrolyte was maintained at 25° C. The current density was brought up to 15 amps/ft$^2$ and held at this current density until the oxalic acid coating formed on the susceptor reached a thickness of about 40–55 mils. The susceptor was then removed from the anodizing bath, rinsed thoroughly, and then dried.

Susceptor samples 1 and 5–7 were anodized in a 15–17% sulfuric acid (indicated as SA in the table) at a temperature of 13° C. (55° F.). The current density was brought up to 15 amps/ft$^2$ and held at this current density until the sulfuric acid coating formed on the susceptor reached a thickness of about 40–55 mils.

All the susceptors were then exposed to a temperature of about 570° C. for a period of about 100 hours following which the temperature was raised to 590° C. and maintained at this level for an additional 300 hours. The results are shown in the following table. It will be seen that samples 1 and 5–7 had sulfur contamination, samples 3–6 had magnesium contamination, and samples 5–8 all showed some degree of cracking or peeling of the coating. Only samples 2 and 8 did not show contamination, and of these, sample 8 had very poor adhesion. Only sample 2, representing the preferred method of the invention for forming the anodized susceptor, showed good adherence of the anodized coating, no cracking, and an absence of contamination.

TABLE

| Sample No. | Electrolyte | Alloy Type | Bead Blast | Cracking/ Peeling | Contamination |
|---|---|---|---|---|---|
| 1 | SA | 1100 | Yes | No | S |
| 2 | OA | 1100 | Yes | No | None |
| 3 | OA | 6061 | Yes | No | Mg |
| 4 | OA | 6061 | No | No | Mg |
| 5 | SA | 6061 | No | Micro | S, Mg |
| 6 | SA | 6061 | Yes | Yes | S, Mg |
| 7 | SA | 1100 | No | Yes* | S |
| 8 | OA | 1100 | No | Yes** | None |

*Slight Non-adhesion
**Gross Non-adhesion

While the invention has been described in terms of preferred embodiments, the claims appended hereto are intended to encompass other embodiments which fall within the spirit of the invention.

Having thus described the invention, what is claimed is:

1. A method of making an improved high temperature-resistant anodized aluminum susceptor used in apparatus for treatment of materials used in semiconductor devices comprising the steps of:

(a) fabricating an aluminum susceptor comprising an aluminum alloy; and (b) anodizing said susceptor in an electrolyte comprising an organic acid to provide said high temperature resistant anodized coating on said susceptor.

2. A method of making an improved anodized aluminum susceptor having a high temperature resistant anodized coating thereon used in apparatus for treatment of materials used in semiconductor devices, the method comprising the steps of:

(a) fabricating an aluminum susceptor comprising an aluminum alloy;

(b) roughening the surface of said susceptor; and
(c) anodizing said susceptor having said roughened surface thereon in an electrolyte comprising an organic acid to provide said high temperature resistant anodized coating on said susceptor.

3. The method in accordance with claim 2 wherein said aluminum alloy has a magnesium content of 0.05 wt. % or less.

4. The method of claim 3 wherein said organic acid comprises a dicarboxylic acid.

5. The method in accordance with claim 2 wherein said step of roughening said susceptor further comprises mechanically roughening said surface.

6. The method in accordance with claim 2 wherein said organic acid comprises a dicarboxylic acid having 2 to 8 carbon atoms.

7. The method in accordance with claim 2 wherein said organic acid is oxalic acid.

8. The method in accordance with claim 2 wherein said aluminum alloy is a high purity aluminum alloy.

9. The method in accordance with claim 2 wherein said alloy contains at least 98.7 wt. % aluminum.

10. The method in accordance with claim 2 wherein said alloy contains at least 99.0 wt. % aluminum.

11. The method in accordance with claim 2 wherein said alloy is selected from AA1000 series aluminum alloys.

12. The method in accordance with claim 2 wherein said susceptor comprises a base having a cladding thereon of high purity aluminum.

13. The method in accordance with claim 2 wherein said susceptor is comprised of an aluminum clad alloy having a high purity cladding thereon.

14. The method in accordance with claim 2 wherein said susceptor is fabricated from an aluminum clad alloy, the cladding on said alloy selected from AA1000 series aluminum alloys.

15. The method of making an improved anodized susceptor comprised of aluminum used in apparatus for treatment of materials used in semiconductor devices, the susceptor having a high temperature resistant anodized coating resistant to cracking, the improvement comprising the steps of:
(a) providing a susceptor having a surface thereof comprised of an aluminum alloy containing at least 99 wt. % aluminum;
(b) roughening the aluminum alloy surface of said susceptor; and
(c) anodizing said susceptor having said roughened surface in an electrolyte comprising a dicarboxylic acid to provide said high temperature resistant anodized coating on said susceptor.

16. The method in accordance with claim 15 wherein said alloy has a magnesium content of 0.5 wt. % or less.

17. The method in accordance with claim 15 wherein said organic acid is oxalic acid.

18. The method in accordance with claim 15 wherein said alloy is AA1100 aluminum alloy.

19. The method in accordance with claim 15 wherein said aluminum alloy is a cladding on a susceptor base.

20. The method in accordance with claim 19 wherein said susceptor base is a higher strength aluminum alloy than said aluminum alloy cladding on said susceptor base.

21. The method in accordance with claim 16 wherein said aluminum alloy contains not more than 0.03 wt. % magnesium.

22. The method of claim 15 in which said dicarboxylic acid electrolyte comprises a 2–8 carbon dicarboxylic acid electrolyte.

23. A method of forming an improved anodized aluminum susceptor having a high temperature resistant anodized coating thereon used in apparatus for treatment of materials used in semiconductor devices, the method comprising the steps of:
(a) providing a susceptor comprised of an aluminum alloy;
(b) roughening the surface of said aluminum alloy comprising said susceptor; and
(c) anodizing said susceptor having said roughened surface in an electrolyte comprising oxalic acid, thereby forming said high temperature resistant anodized coating on said susceptor.

24. An improved aluminum susceptor resistant to high temperature without substantial cracking and used in apparatus for treatment of materials used in semiconductor devices, the susceptor comprising: a base comprised of an aluminum alloy containing not more than 0.05 wt. % magnesium; a roughened surface; and an anodic coating comprised of an organic acid anodic coating on said surface.

25. The susceptor in accordance with claim 24 wherein said aluminum alloy is at least 98.7 wt. % aluminum.

26. The susceptor in accordance with claim 24 wherein said aluminum alloy is at least 99.0 wt. % aluminum.

27. The susceptor in accordance with claim 24 wherein said alloy is selected from AA1000 series aluminum alloys.

28. The susceptor in accordance with claim 24 wherein said alloy is selected from AA1100 and AA1200 aluminum alloys.

29. The susceptor in accordance with claim 24 wherein said alloy is AA1100 aluminum alloy.

30. The susceptor in accordance with claim 24 wherein said surface is of higher purity aluminum alloy than said base.

31. The susceptor in accordance with claim 30 wherein said base is comprised of an aluminum alloy having a higher strength than the aluminum alloy of said surface at room temperature.

32. The susceptor in accordance with claim 24 wherein the magnesium content of said aluminum alloy of at least said surface is not more than 0.03 wt. %.

33. An improved aluminum susceptor resistant to high temperature and cracking and used in apparatus for treatment of materials used in semiconductor devices, the susceptor comprised of:
(a) an aluminum alloy having a surface roughness; and
(b) an anodic coating formed on said aluminum susceptor by anodizing said aluminum susceptor in an organic acid electrolyte and resistant to cracking and peeling at high temperatures.

34. The improved susceptor of claim 33, wherein said anodic coating is formed in an electrolyte comprising a dicarboxylic acid.

35. The improved susceptor of claim 33, wherein said anodic coating is formed in an electrolyte comprising oxalic acid.

36. The improved susceptor of claim 33 wherein said susceptor comprises a high-purity aluminum alloy cladding overlying a lower-purity aluminum-alloy base, with said anodic coating being formed over said high-purity cladding.

37. The improved susceptor of claim 33 wherein said susceptor has a surface and at least the aluminum alloy nearest said surface of said susceptor has a magnesium content of 0.05 wt. % or less.

38. A method of making an improved anodized aluminum susceptor used in apparatus for treatment of materials used in semiconductor devices comprising the steps of:

(a) fabricating an aluminum susceptor comprising an aluminum alloy having a magnesium content of 0.5 wt. % or less; and (b) anodizing said susceptor in an electrolyte comprising an organic acid to provide said high temperature resistant anodized coating on said susceptor.

39. The method of claim 38 including the further step of roughening the surface of said susceptor prior to said step of anodizing said susceptor.

40. The method in accordance with claim 38 wherein said organic acid comprises a dicarboxylic acid having 2 to 8 carbon atoms.

41. The method in accordance with claim 38 wherein said organic acid is oxalic acid.

42. The method in accordance with claim 38 wherein said aluminum alloy is a high purity aluminum alloy.

43. The method in accordance with claim 38 wherein said alloy contains at least 98.7 wt. % aluminum.

44. The method in accordance with claim 38 wherein said alloy contains at least 99.0 wt. % aluminum.

45. The method in accordance with claim 38 wherein said alloy is selected from AA1000 series aluminum alloys.

46. The method in accordance with claim 38 wherein said susceptor comprises a base having a cladding thereon of high purity aluminum.

47. The method in accordance with claim 38 wherein said susceptor is comprised of an aluminum clad alloy having a high purity cladding thereon.

48. The method in accordance with claim 38 wherein said susceptor is fabricated from an aluminum clad alloy, the cladding on said alloy selected from AA1000 series aluminum alloys.

* * * * *